United States Patent
Fang et al.

(10) Patent No.: US 8,473,881 B1
(45) Date of Patent: Jun. 25, 2013

(54) MULTI-RESOURCE AWARE PARTITIONING FOR INTEGRATED CIRCUITS

(75) Inventors: Wei Mark Fang, Scarborough (CA); Vishal Suthar, Milpitas, CA (US); Srinivasan Dasasathyan, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 256 days.

(21) Appl. No.: 13/007,780

(22) Filed: Jan. 17, 2011

(51) Int. Cl.
*G06F 17/50* (2006.01)

(52) U.S. Cl.
USPC ............ 716/105; 716/110; 716/119; 716/122; 716/124; 716/125

(58) Field of Classification Search
USPC .................................. 716/105–111, 119–126
See application file for complete search history.

(56) References Cited

U.S. PATENT DOCUMENTS 7,694,256 B1 * 4/2010 Galloway et al. ............ 716/124

OTHER PUBLICATIONS

U.S. Appl. No. 12/777,991, filed May 11, 2010, Tom, M., et al., Xilinx, Inc., 2100 Logic Drive, San Jose, CA 95124.
Fiduccia, C.M., et al., A Linear-Time Heuristic for Improving Network Partitions, Proceedings of 19$^{th}$ Design Automation Conference, Paper 13.1, pp. 175-181, Jun. 1982.
Karypis, G., et al., Multilevel Hypergraph Partitioning: Applications in VLSI Domain, IEEE Transactions on VLSI Systems, vol. 7, No. 1, pp. 69-79, Mar. 1999.
Selvakkumaran, N., et al., Multi-Resource Aware Partitioning Algorithms for FPGAs with Heterogeneous Resources, Proceedings of Design Automation Conference(DAC 2004), pp. 741-746, Jun. 7-11, 2004, San Diego, CA USA.

* cited by examiner

*Primary Examiner* — Paul Dinh
(74) *Attorney, Agent, or Firm* — Kevin T. Cuenot

(57) ABSTRACT

A method of partitioning a circuit design can include identifying a circuit design in which components of the circuit design are assigned to each of a plurality of regions, wherein each region corresponds to a physical portion of an integrated circuit. A maximum oversubscription region can be determined for a selected component type from the plurality of regions. A target region from the plurality of regions can be selected that is adjacent to the region of maximum oversubscription. The method also can include re-assigning, by a processor, a selected number of components of the maximum oversubscription region to the target region.

14 Claims, 3 Drawing Sheets

MULTI-RESOURCE AWARE PARTITIONING FOR INTEGRATED CIRCUITS

FIELD OF THE INVENTION

One or more embodiments disclosed within this specification relate to integrated circuits (ICs). More particularly, one or more embodiments relate to partitioning a circuit design for implementation within an IC.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

To implement a circuit design within an IC, e.g., a programmable IC, the various hardware units available within the IC are configured to perform a function of a component, e.g., implement the component, in the circuit design. Implementing the circuit design within the IC typically requires a plurality of processing steps. One of the processing steps is called partitioning. Partitioning refers to a process in which components of a circuit design are grouped into "partitions." Each of the partitions is assigned to a particular region, e.g., a physical area, of the IC. The components assigned to a partition are implemented using the hardware units available within the region to which the partition is assigned.

The electronic design automation (EDA) tools that implement the partitioning process are referred to as "partitioners." Partitioners suffer from several disadvantages that render the tools less effective for use with modern circuit designs and modern ICs. One disadvantage of many partitioners is the inability to partition a circuit design across more than two different regions. Many partitioners, for example, can bisect a circuit design, but are not scalable to address situations in which an IC is to be divided into three or more partitions or regions.

Another disadvantage of many partitioners is the inability to contend with more than one type of component and corresponding hardware unit. Such partitioners can treat the circuit design as if the entire circuit design includes only a single type of component. Partitioners that recognize only a single component type are unable to effectively partition a circuit design that includes multiple types of components that is to be implemented in more complex ICs of the varieties described herein.

SUMMARY

One or more embodiments disclosed within this specification relate to integrated circuits (ICs) and, more particularly, to partitioning a circuit design for implementation within an IC.

An embodiment can include a method of partitioning a circuit design. The method can include identifying a circuit design including components assigned to each of a plurality of regions. Each region can correspond to a physical portion of an IC. A maximum oversubscription region for a selected component type can be determined from the regions. A target region adjacent to the maximum oversubscription region can be selected from the regions. The method further can include re-assigning, by a processor, a selected number of components of the maximum oversubscription region to the target region.

Another embodiment can include a system. The system can include a memory that stores program code for partitioning a circuit design and a processor coupled to the memory. The processor, upon executing the program code, can be configured to perform acts including identifying a circuit design including components assigned to each of a plurality of regions, wherein each region corresponds to a physical portion of an IC, and determining a maximum oversubscription region for a selected component type from the regions. The processor further can be configured to perform acts including selecting a target region adjacent to the maximum oversubscription region from the regions and re-assigning a selected number of components of the maximum oversubscription region to the target region.

Another embodiment can include a device. The device can include a non-transitory data storage medium usable by a system. The data storage medium can store program code that partitions a circuit design. The data storage medium can include program code configured to identify a circuit design including components assigned to each of a plurality of regions, wherein each region corresponds to a physical portion of an integrated circuit, and program code configured to determine a maximum oversubscription region for a selected component type from the regions. The data storage medium also can include program code configured to select a target region adjacent to the maximum oversubscription region from the regions and program code configured to re-assign a selected number of components of the maximum oversubscription region to the target region.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to partitioning a circuit design for implementation within an IC. In accordance with an embodiment disclosed herein, a circuit design can be partitioned into two or more different partitions. Each partition, in general, is assigned to a particular region of one or more ICs. A region, for example, can refer to a physical portion, or area, of an IC. Each region is generally characterized by capacity constraints that dictate the one or more different types of components of the circuit design that can be implemented within that region and the number of each different component type that can be implemented within that region. The circuit design can be partitioned in a way that results in a legal apportionment of the various component types of the circuit design across two or more regions.

Figure 1:
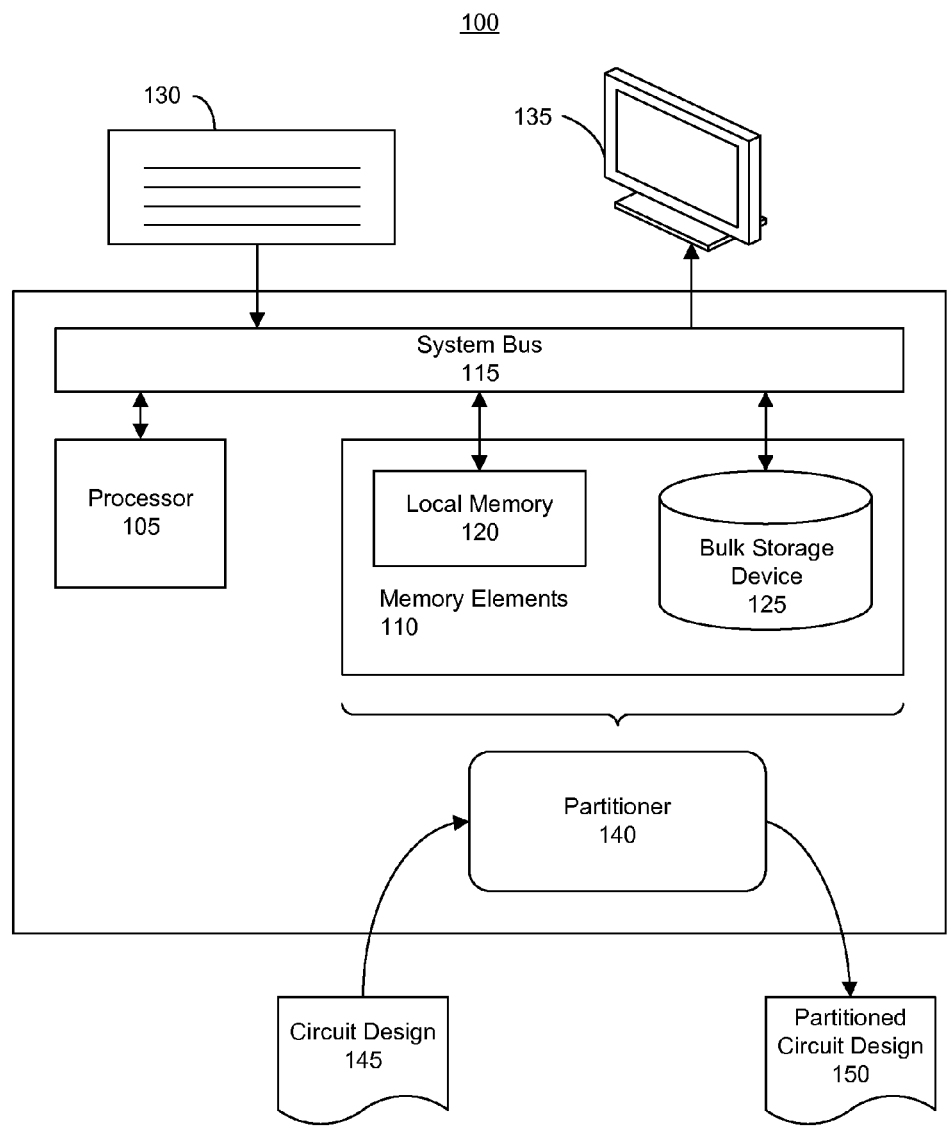
FIG. 1 is a first block diagram illustrating a system for partitioning a circuit design in accordance with an embodiment disclosed within this specification.

FIG. 1 is a first block diagram illustrating a system 100 for partitioning a circuit design in accordance with an embodiment disclosed within this specification. System 100 can include at least one processor 105 coupled to memory elements 110 through a system bus 115. As such, system 100 can store program code within memory elements 110. Processor 105 can execute the program code accessed from memory elements 110 via system bus 115. In one aspect, for example, system 100 can be implemented as a computer that is suitable for storing and/or executing program code. It should be appreciated, however, that system 100 can be implemented in the form of any system including a processor and memory that is capable of performing the functions described within this specification.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

As pictured in FIG. 1, memory elements 110 can store a partitioner 140. Partitioner 140, being implemented in the form of executable program code, can be executed by system 100. System 100, through execution of partitioner 140, can receive a circuit design 145 as input and process circuit design 145 to generate a partitioned circuit design 150 that includes two or more partitions. Each of the two or more partitions can include two or more different component types, where each component type is subject to a capacity constraint. The capacity constraint can be region and/or component type specific. Partitioned circuit design 150 can be implemented within an IC, e.g., a programmable IC. For example, partitioned circuit design 150 can undergo placement, routing, and/or other optimizations.

In one aspect, circuit design 145, can be an un-partitioned circuit design. In another aspect, circuit design 145 can be partitioned using any of a variety of partitioning techniques, including known partitioning techniques, that generate a partitioned circuit design. When initially partitioned, circuit design 145, for example, can include one or more violations of capacity constraints, to be described within this specification in further detail. For example, circuit design 145 can be output from an initial partitioning procedure as described within this specification.

In an embodiment, circuit design 145 can include one type of component that is to be partitioned across two or more different regions, e.g., two, three, four, or more regions. In another embodiment, circuit design 145 can include a mix of heterogenous component types, e.g., two or more different component types that are to be partitioned across two or more regions.

The term "region" can refer to a physical area of an IC having a defined boundary. In illustration, a single IC can be divided into a plurality of different regions, e.g., thirds, fourths, or the like, where each region has a defined geometric shape. In the case of an IC that includes multiple dies, each region can represent a die. In another example, when implementing a circuit design across a plurality of ICs, each region can represent an entire IC. Within this specification, one or more embodiments are described in terms of regions of an IC. It should be appreciated, however, that the one or more embodiments can be applied to partitioning of a circuit design for implementation within an IC having a single die with two or more regions, a multi-die IC where each die corresponds to a region, or a multi-IC system where each IC corresponds to a region, depending upon how regions are defined within the formulation of the partitioning process.

Each region typically includes a plurality of available hardware units referred to as sites. Each site can correspond to a particular component type. Examples of different types of sites can include lookup tables (LUTs), random access memories (RAMs), digital signal processing (DSP) units, or the like. Each hardware unit, or site, can implement one component of the circuit design. The circuit design can be expressed programmatically using a hardware description language, as a netlist, or the like. The circuit design can be processed, e.g., synthesized, to a point where the circuit design specifies a plurality of components having a defined connectivity among one another. Each of the components can belong to one of a plurality of different component types that are assignable to sites of the IC that have a matching type. For example, some components are of the type "LUT" and can be assigned to LUT type sites. Other components are of the type "DSP" and can be assigned to "DSP" type sites, etc.

To implement the circuit design, each component must be assigned to a particular site. Partitioning the circuit design facilitates improved quality of design. For example, partitioning can lead to improved routing, improved timing, reduction in congestion, and the like for the overall circuit design as implemented within the IC. Because each region corresponds to a physical area of an IC, each region has physical limitations or constraints as to the number of sites that each region includes and the various types of sites included within each respective region. These constraints, referred to as capacity constraints, must be observed in order to determine a feasible, or legal, partitioning of the circuit design. Assigning more components of a given type than available sites of that type to a region results in a violation of a capacity constraint.

In an embodiment, each region can have a same or uniform set of capacity constraints. For example, each region can be defined to be the same as each other region. In another embodiment, however, capacity constraints can vary from one region to another. For example, regions can be shaped differently. Accordingly, the capacity constraints can vary from one region to another in terms of which component types can be implemented within the region and/or the number of different component types that can be implemented within the region.

Partitioner 140 can apply one or more partitioning techniques to circuit design 145 to achieve a partitioned version of circuit design 145 illustrated as partitioned circuit design 150. Partitioned circuit design 150 is an implementation of the circuit design that includes two or more partitions, e.g., groups of components, in which violations of capacity constraints have been removed. Partitioned circuit design 150 can be output to memory elements 110. As used herein, "outputting" and/or "output" can mean storing in memory elements 110, for example, writing to a file stored in memory elements 110, writing to display 135 or other peripheral output device, sending or transmitting to another system, exporting, or the like.

Figure 2:
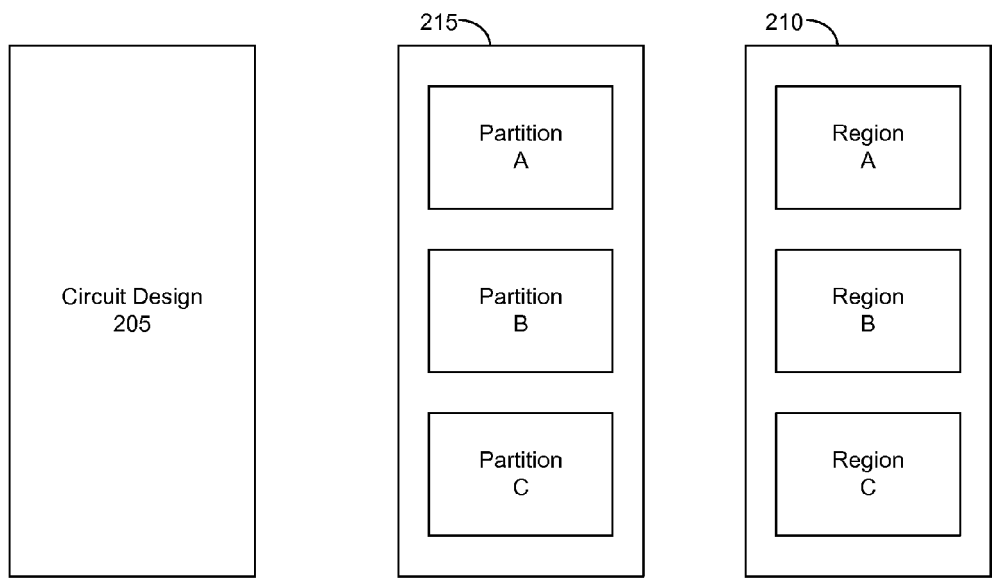
FIG. 2 is a second block diagram illustrating a partitioning technique in accordance with another embodiment disclosed within this specification.

FIG. 2 is a second block diagram illustrating a partitioning technique in accordance with another embodiment disclosed within this specification. FIG. 2 illustrates a circuit design 205. Circuit design 205, for purposes of illustration, includes 8,000 LUT type components and 120 DSP type components that must be placed, or assigned, to sites of matching type on IC 210. As shown, IC 210 includes three different regions labeled region A, region B, and region C. Accordingly, circuit design 205 must be processed using a system as illustrated, for example, in FIG. 1, to generate a partitioned circuit design 215 in which components of circuit design 205 are assigned to three different partitions illustrated as partition A, partition B, and partition C.

In general, each partition corresponds to one region. For example, partition A can be assigned to region A, partition B can be assigned to region B, and partition C can be assigned to region C. Thus, any physical constraints that exist for a given region can also be said to apply to, or exist for, the partition that is assigned to that region. A component assigned to a particular partition can also be said to be assigned to the region to which the partition is assigned. In this regard, the terms "partition" and "region" can be used interchangeably within this specification from time-to-time.

IC 210 can be structured so that each of regions A, B, and C includes 3,000 LUT sites and 40 DSP sites. As noted, the physical constraints of each region can be ascribed, or assigned, to each corresponding partition. For example, in order to assign partition A to region A, partition A must have 3,000 or fewer LUT type components and 40 or fewer DSP type components. In this example, since regions A, B, and C have the same capacity constraints for LUTs and DSP sites, the number of LUT type components assigned to each partition must not exceed 3,000. Similarly, the number of DSP type components assigned to each partition must not exceed 40. Assigning more LUT components than available LUT sites to a given partition results in a capacity constraint violation. Similarly, assigning more DSP components than available DSP sites in a given partition results in a capacity constraint violation.

Many partitioners operate upon a circuit design by utilizing a "min-cut" strategy. As noted, the components of a circuit design have a defined connectivity among themselves in reference to the nets, or wires, that couple the components together. Appreciably, assigning components of circuit design 205 to different regions means that wires must traverse between regions of IC 210 in order to effectuate the connectivity specified by the circuit design. Often, the number of available wires joining two regions is limited in some way. For example, when regions correspond to dies, IC 210 can have a limited number of wires available coupling regions A, B, and C. When regions correspond to ICs on a board, there can be a limited number of traces available to couple the ICs.

In any case, this limitation imposes additional constraints on the partitioning process. The resulting partitioned circuit design cannot require more wires to establish connectivity among the components as specified by the circuit design than are physically available to connect the regions. A min-cut partitioner seeks to determine a partitioning of the circuit design that has a minimum number of wires crossing between partitions.

The term "capacity" can refer to the number of sites capable of implementing a selected component type in a region of an IC. Referring to the example above, each of regions A, B, and C can be said to have a LUT capacity of 3,000 and a DSP capacity of 40. Conventional partitioners operate under the presumption that the circuit design to be partitioned includes only one type of component. Thus, instead of evaluating IC 210 as including regions with two different and distinct capacity constraints that must be observed, conventional partitioners group the DSP capacity with the LUT capacity together and consider each of the regions to have an overall capacity of 3,040 sites. This treatment of component type can lead to situations in which the partitioner, while attempting to find a min-cut solution, assigns fewer than 3,040 total components to a given partition, but more than 40 DSPs to the partition or more than 3,000 LUTs to the partition. Either of these situations results in an illegal condition, e.g., a violation of the capacity constraint of a region, that means that circuit design 205, as partitioned, cannot be implemented within IC 210.

Figure 3:
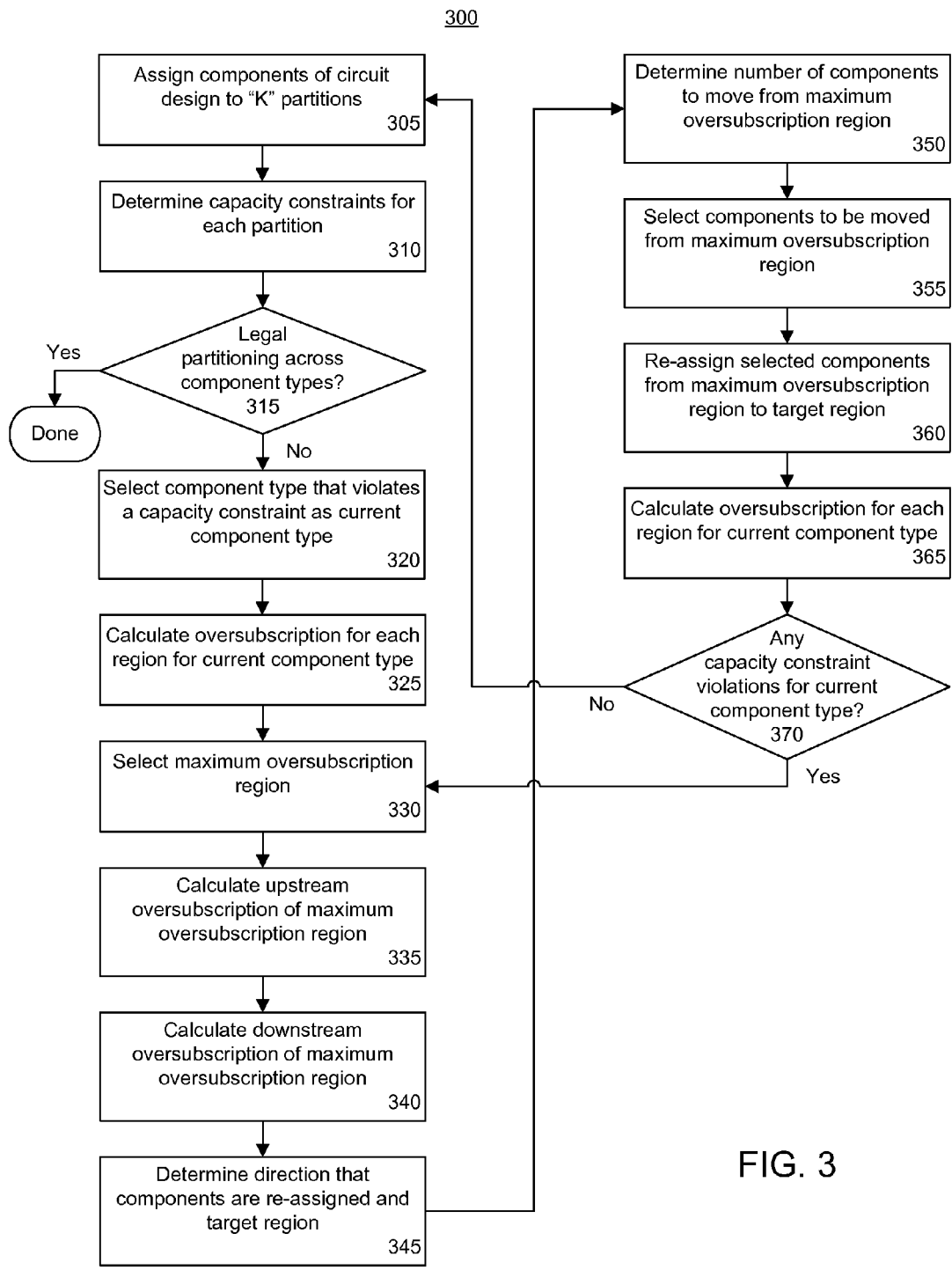
FIG. 3 is a flow chart illustrating a method of partitioning a circuit design in accordance with another embodiment disclosed within this specification.

FIG. 3 is a flow chart illustrating a method 300 of partitioning a circuit design in accordance with another embodiment disclosed within this specification. Method 300 can be implemented using a system as described with reference to FIGS. 1 and 2 within this specification. Method 300 can be used to partition a circuit design that includes one or more different component types into "K" different partitions or regions, where "K" is an integer value that is greater than or equal to 2. Thus, method 300 can be used to partition a circuit design into 2, 3, 4, or more partitions.

Accordingly, in step 305, the system can assign components of the circuit design to K different partitions. In an embodiment, step 305 can represent an initial partitioning of the circuit design that can be performed using any of a variety of known partitioning techniques, e.g., a min-cut type of technique or the like, whether or not the technique is suited for more than one component type or for partitioning into more than two partitions, e.g., where K>2. The initial partitioning, for example, can be performed using a partitioning technique that ignores component type where all components are treated as a same or single component type. As such, application of step 305 likely results in a partitioned circuit design that includes one or more capacity constraint violations within one or more regions, and thus, partitions.

It should be appreciated that while the partitioning performed in step 305 does not utilize capacity constraints and/or component type when determining a partitioning, other metrics can be used. For example, partitioning can utilize wire length, congestion, or the like to determine a partitioning, or assignment, of components to the K different regions. The one or more embodiments disclosed within this specification, however, are not limited to the examples provided. Other partitioning techniques can be employed in step 305 including, for example, a random assignment of components to regions or partitions. In any case, as noted, method 300 can be applied to a circuit design in which an initial partitioning has already been performed to remove capacity constraint violations.

In step 310, the system can determine the capacity constraints that are applicable for each region, and thus, partition. The system can determine the types of sites available within each region and the number of each different type of site available within each region. As noted, a region can have one capacity constraint for each type of site included within that region. Further, the capacity constraints can be ascribed to the particular partition that is to be assigned to that region since a one-to-one correspondence exists between partitions and regions. As noted, each region can have 1, 2, or more different types of available sites.

In step 315, the system can determine whether the current partitioning of the circuit design is a legal partitioning across each component type. More particularly, the system can evaluate, on a per-partition basis, whether each partition meets the capacity constraints of that partition for each different component type. For each partition, the system determines whether the number of a particular component type of the circuit design that is assigned to that partition exceeds the number of sites of the same type available within the partition.

The system can perform the calculation for each different component type of each partition. When the current partitioning of the circuit design does not include any capacity constraint violations, the partitioning is legal and method 300 can end. When the current partitioning of the circuit design does include one or more capacity constraint violations, method 300 can proceed to step 320.

Continuing with step 320, the system has determined that one or more different component types, e.g., those with capacity constraint violations, must be rebalanced among the partitions. Beginning in step 320, the system can systematically and iteratively begin correcting the capacity constraint violations. In general, the system can select one component type for correction and iteratively rebalance components of the selected component type. When balanced, the system can select a next component type for rebalancing until the capacity constraint violations are removed from the circuit design being partitioned.

In step 320, the system can select a component type that violates a capacity constraint of at least one partition as the current component type for processing. In an embodiment, the system can select any of the violating component types for processing as the current component type. In another embodiment, the system can select the component type that has the highest number of capacity constraint violations across all regions as the current component type. In another embodiment, the system can select the component type that has the fewest number of capacity constraint violations across all regions as the current component type.

In step 325, the system can calculate an oversubscription for each region for the current component type, e.g., the component type selected in step 320. For ease of illustration, consider an IC that includes four regions 1, 2, 3, and 4, with each region having a capacity for a component of type X of 25 sites. Thus, each of regions 1-4 includes 25 sites to which a component of type X can be assigned. Each of regions 1-4 has a capacity of 25% of the total capacity across all regions. Regions 1-4, therefore, collectively provide 100% capacity for component type X.

Utilization of sites of a particular type can be expressed as a percentage and can be determined as a ratio of the number of components assigned to a region (partition) to the capacity of that region. Oversubscription can be calculated as the utilization of a region minus the capacity of the region for the current component type. The oversubscription of a region can be positive or negative. A positive oversubscription indicates that more components are assigned to a region than available sites. A negative oversubscription indicates that fewer components are assigned to a region than available sites. For purpose of illustration, component type X of the circuit design being partitioned can have an overall utilization across all regions of 95%.

Table 1 below illustrates an example in which each of regions 1-4 has 25% capacity for component type X. Regions are listed in decreasing order, e.g., region 4, 3, 2, and then 1. The column for utilization of site type X within each region indicates the percentage to which that region is oversubscribed or undersubscribed. Because there are 100 sites in this example, each percentage point corresponds to one site and/or one component. The column showing utilization of site type X sums to 95% to illustrate 95% utilization of site type X by the circuit design being partitioned across all regions. The column showing component type X capacity sums to 100% illustrating the total capacity of the regions to accommodate component type X.

TABLE 1

| Region | Component Type X Capacity (%) | Utilization of Site Type X (%) | Oversubscription (%) |
|---|---|---|---|
| 4 | 25 | 30 | +5 |
| 3 | 25 | 45 | +20 |
| 2 | 25 | 10 | −15 |
| 1 | 25 | 10 | −15 |

From step 305, region 1 has been assigned 10 of component type X and, therefore has an oversubscription that is negative, e.g., −15. Region 1 has 15 unused sites for component type X. Region 2 has been assigned 10 of component type X and, therefore has an oversubscription of −15. Like region 1, region 2 has 15 unused sites for component type X. Region 3 has been assigned 45 of component type X and, therefore has an oversubscription that is positive, e.g., +20. Region 3 has 20 more of component type X than available sites. Region 4 has been assigned 30 of component type X and, therefore has an oversubscription that is +5. Region 4 has 5 more of component type X than available sites.

In step 330, the system can select the maximum oversubscription region, e.g., the region with the largest oversubscription. The system determines the largest positive oversubscription which, in this example, is region 3. In step 335, the system can calculate an upstream oversubscription. In general, the terms "upstream" and "downstream" are directional indicators among regions using the maximum oversubscription region as the reference. Referring again to Table 1, upstream oversubscription can be calculated as the sum of the oversubscriptions for each region listed above region 3 in Table 1, e.g., each region number greater than 3. In this example, the upstream oversubscription of region 3 is the oversubscription of region 4, which is +5. In step 340, the system can calculate a downstream oversubscription. Downstream oversubscription can be calculated as the sum of the oversubscriptions for each region listed below region 3 in Table 1, e.g., regions having a region number less than 3. In this example, the downstream oversubscription of region 3 is the sum of the oversubscription of region 1 and region 2. Accordingly, the downstream oversubscription of region 3 is −30.

In step 345, the system can determine the direction in which components from the maximum oversubscription region are to be re-assigned, or flow, and select the target region. The direction can be determined according to the upstream and downstream oversubscriptions. In general, components are re-assigned from the maximum oversubscription region to a region that is immediately adjacent to the maximum oversubscription region, referred to as the target region, in either the upstream or the downstream direction.

Since oversubscription is defined as utilization minus capacity, any region with a positive oversubscription is violating the capacity constraint for component type X in that region. In general, components of type X are moved, or re-assigned, from regions (and thus partitions) of positive oversubscription to regions of negative oversubscription. This migration of components legalizes the partitioning of component type X across all regions. Components generally are re-assigned and flow from the maximum oversubscription region to an adjacent, or neighboring, region in either the upstream or downstream direction according to which direction has the lowest oversubscription. Referring to Table 1, the system re-assigns components of type X from region 3 to adjacent region 2, i.e., the target region, in the downstream direction since the downstream oversubscription is −30 and the upstream oversubscription is +5, indicating that there are more available sites for components of type X in the downstream direction. Thus, the system selects region 2 as the target region.

Table 2 below illustrates the flow, or re-assignment, of components from the maximum oversubscription region to the target region based upon calculated upstream and downstream oversubscriptions. As illustrated in Table 2, when both upstream and downstream oversubscriptions are negative, the components can be moved in either direction. Accordingly, another metric can be used to make the determination if desired or, in the alternative, a particular direction simply can be selected and used, e.g., either always upstream or always downstream.

TABLE 2

| Upstream Oversubscription | Downstream Oversubscription | Direction of Component Flow (Re-assignment) |
|---|---|---|
| Positive | Negative | Downstream region adjacent to maximum oversubscription region is target region |
| Negative | Positive | Upstream region adjacent to maximum oversubscription region is target region |
| Negative | Negative | Move in either direction |

In step 350, the system can determine the number of components of type X that are to be moved from the maximum oversubscription region to the target region. In an embodiment, at least the oversubscription amount from the maximum oversubscription region can be re-assigned to the target region. For example, referring to Table 1, at least 20 components can be re-assigned from region 3 to region 2. In another embodiment, the number of components to be moved can be increased beyond the amount of oversubscription of the maximum oversubscription region. Increasing the number of components accommodates for oversubscription in other regions such as region 4, for example, which will eventually migrate to region 3 in subsequent iterations of the process described in FIG. 3.

In illustration, the number of components to be moved can be determined as the oversubscription of the maximum oversubscription region plus the oversubscription of the opposite stream. The opposite stream refers to the direction opposite the direction of the target region. Thus, referring to the example shown in Table 1, the number of components to be moved can be calculated as the oversubscription of region 3 plus the oversubscription of the opposite stream, e.g., the sum of the oversubscription of each region greater than 3. In this example, since the target region is in the downstream direction, the opposite stream refers to the upstream oversubscription. The opposite stream is the oversubscription of region 4. Accordingly, 25 components can be moved.

In step 355, the system can select the components from the maximum oversubscription region that are to be moved. The system can select components that minimize net crossings from one region to another region after re-assignment of the component. For example, for each component in the maximum oversubscription region, the system can calculate the increase in the number of nets that cross from one region to another as a result of re-assigning the component from the maximum oversubscription region to the target region. The system can sort the components according to the calculated increase in net crossing resulting from re-assignment of each component and select "N" components that result in the lowest increases in net crossings from one region to another. In this example, N can be an integer value calculated in step 350. In an embodiment, the change or increase in cut size, e.g., wires or nets crossing regions, can be calculated using procedures described in C. M. Fiduccia et al., "A Linear-Time Heuristic for Improving Network Partitions," Proceedings of Design Automation Conference, pps. 175-181 (1982), which is fully incorporated herein by reference in its entirety.

In step 360, the system can re-assign the components selected in step 355 from the maximum oversubscription region to the target region. Table 3 below illustrates the state of the partitioning of the circuit design after performing step 360 a first time in the column labeled "iteration 1." The column labeled iteration 0 illustrates the state of partitioning of the circuit design after step 305, e.g., after performing the initial partitioning of the circuit design. As shown, the capacity constraint violation of region 3 has been removed. Capacity constraint violations for region 4, however, still remain. Further, rebalancing has caused a capacity constraint violation in region 2.

TABLE 3

| Region | Oversubscription Iteration 0 | Oversubscription Iteration 1 | Oversubscription Iteration 2 | Oversubscription Iteration 3 |
|---|---|---|---|---|
| 4 | +5 | +5 | +5 | 0 |
| 3 | +20 | −5 | −5 | 0 |
| 2 | −15 | +10 | 0 | 0 |
| 1 | −15 | −15 | −5 | −5 |

In step 365, the system can calculate the oversubscription across regions for the current component type, e.g., component type X. In step 370, the system can determine whether any capacity constraint violations exist for the current component type. When at least one capacity constraint violation exists, method 300 can loop back to step 330 to continue re-assigning components of the current component type until no regions have a capacity constraint violation for component type X.

Table 3 illustrates that after four iterations, component type X is partitioned legally without any capacity constraint violations. After each iteration, the system can mark the components that are re-assigned in that iteration so that the same components are not re-assigned during any subsequent iterations of the partitioning process. Preventing continued re-assignment of components from one iteration to the next effectively guarantees convergence of the iterative process.

Referring again to step 370, when no capacity constraint violations exist for the current component type, method 300 can loop back to step 305 to re-partition the circuit design with the exception of any components that have been re-assigned through the process described with reference to FIG. 3. Keeping legalized region assignments fixed for components that have been re-assigned during any pass or iteration of step 360 facilitates convergence and also allows for metrics other than capacity constraints to be incorporated into the partitioning process. For example, as noted, the partitioning performed in step 305 can utilize metrics relating to wire length, congestion, or the like to determine a partitioning, or assignment, of components to the K different regions.

In another embodiment, after step 370, the method can loop back to step 315 instead of step 305. Looping back to step 315, however, does not allow for partitioning to take into account circuit design metrics other than capacity constraints.

Method 300 illustrates an exemplary process for partitioning a circuit design into "K" different regions or partitions. The way in which components are re-assigned and migrate from regions of positive oversubscription to regions of negative oversubscription accounts for the way in which the regions are physically connected to one another. For example, consider the case in which each region represents a die of a multi-die IC. By assigning the dies appropriate region numbers, sorting the dies in increasing or decreasing order, and maintaining that ordering throughout the partitioning process, the components of the circuit design can be partitioned across the regions in a way that takes into account actual physical connectivity among the dies.

For example, components are shifted from a die that is maximally oversubscribed to a neighboring and physical adjacent die either upstream or downstream. In a configuration where the dies are stacked one on top of the other, configured side-by-side in a row, or arranged in four different quadrants, e.g., in a ring-like configuration, numbering the dies and computing upstream and/or downstream oversubscriptions according to the physical layout or positioning of the dies as described while maintaining die order throughout the partitioning process ensures that the partitioned solution is feasible within the actual physical IC or ICs.

The flowchart in the figures illustrates the architecture, functionality, and operation of possible implementations of systems, methods and computer program products according to one or more embodiments disclosed within this specification. In this regard, each block in the flowchart can represent a module, segment, or portion of code, which includes one or more portions of executable program code that implements the specified logical function(s).

It should be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which includes features enabling the implementation of the methods described herein. The device can include a data storage medium, e.g., a non-transitory computer-usable or computer-readable medium, storing program code that, when loaded and executed in a system including memory and a processor, causes the system to perform at least a portion of the functions described within this specification. Examples of non-transitory data storage media can include, but are not limited to, optical media, magnetic media, magneto-optical media, computer memory such as random access memory or hard disk(s), or the like.

The terms and/or phrases "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of partitioning a circuit design, the method comprising:
    identifying a circuit design comprising components assigned to each of a plurality of regions, wherein each region corresponds to a physical portion of an integrated circuit;
    determining a maximum oversubscription region for a selected component type from the plurality of regions;
    wherein the maximum oversubscription region is the region having a largest positive oversubscription, and oversubscription is defined as a utilization of a region minus a capacity of the region for the selected component type;
    selecting a target region adjacent to the maximum oversubscription region from the plurality of regions;
    re-assigning, by a processor, a selected number of components of the maximum oversubscription region to the target region; and
    determining the selected number of components to be re-assigned from the maximum oversubscription region to the target region according to an oversubscription of the maximum oversubscription region added to a greater of a downstream oversubscription or an upstream oversubscription.

2. The method of claim 1, wherein selecting a target region further comprises:
    selecting the target region to be an upstream region of the plurality of regions that is adjacent to the maximum oversubscription region when an upstream oversubscription is less than a downstream oversubscription; and
    selecting the target region to be a downstream region of the plurality of regions that is adjacent to the maximum oversubscription region when the downstream oversubscription is less than the upstream oversubscription.

3. The method of claim 1, wherein the selected component type is chosen from a plurality of component types according to number of capacity constraints violated across each of the plurality of regions on a per-component type basis.

4. The method of claim 1, wherein the plurality of regions comprises at least three regions.

5. The method of claim 1, wherein the circuit design comprises at least two component types.

6. The method of claim 5, wherein each component type is subject to a type-specific capacity constraint within each of the plurality of regions.

7. A system comprising:
    a memory storing program code for partitioning a circuit design; and
    a processor coupled to the memory, wherein the processor, upon executing the program code, is configured to perform a plurality of acts comprising:
    identifying a circuit design comprising components assigned to each of a plurality of regions, wherein each region corresponds to a physical portion of an integrated circuit;
    determining a maximum oversubscription region for a selected component type from the plurality of regions;
    wherein the maximum oversubscription region is the region having a largest positive oversubscription, and oversubscription is defined as a utilization of a region minus a capacity of the region for the selected component type;
    selecting a target region adjacent to the maximum oversubscription region from the plurality of regions;
    re-assigning a selected number of components of the maximum oversubscription region to the target region; and
    determining the selected number of components to be re-assigned from the maximum oversubscription region to the target region according to an oversubscription of the maximum oversubscription region added to a greater of a downstream oversubscription or an upstream oversubscription.

8. The system of claim 7, wherein selecting a target region further comprises:
    selecting the target region to be an upstream region of the plurality of regions that is adjacent to the maximum oversubscription region when an upstream oversubscription is less than a downstream oversubscription; and
    selecting the target region to be a downstream region of the plurality of regions that is adjacent to the maximum oversubscription region when the downstream oversubscription is less than the upstream oversubscription.

9. The system of claim 7, wherein the selected component type is chosen from a plurality of component types according to number of capacity constraints violated across each of the plurality of regions on a per-component type basis.

10. The system of claim 7, wherein the plurality of regions comprises at least three regions.

11. The system of claim 7, wherein the circuit design comprises at least two component types.

12. The system of claim 11, wherein each component type is subject to a type-specific capacity constraint within each of the plurality of regions.

13. A device comprising:
    a non-transitory data storage medium usable by a system, wherein the data storage medium stores program code that partitions a circuit design, the data storage medium comprising:
    program code configured to identify a circuit design comprising components assigned to each of a plurality of regions, wherein each region corresponds to a physical portion of an integrated circuit;

program code configured to determine a maximum oversubscription region for a selected component type from the plurality of regions;

wherein the maximum oversubscription region is the region having a largest positive oversubscription, and oversubscription is defined as a utilization of a region minus a capacity of the region for the selected component type;

program code configured to select a target region adjacent to the maximum oversubscription region from the plurality of regions;

program code configured to re-assign a selected number of components of the maximum oversubscription region to the target region; and program code configured to determine the selected number of components to be re-assigned from the maximum oversubscription region to the target region according to an oversubscription of the maximum oversubscription region added to a greater of a downstream oversubscription or an upstream oversubscription.

14. The device of claim 13, wherein the program code configured to select a target region further comprises:

program code configured to select the target region to be an upstream region of the plurality of regions that is adjacent to the maximum oversubscription region when an upstream oversubscription is less than a downstream oversubscription; and program code configured to select the target region to be a downstream region of the plurality of regions that is adjacent to the maximum oversubscription region when the downstream oversubscription is less than the upstream oversubscription.

* * * * *